(12) United States Patent
Vet

(10) Patent No.: US 7,161,327 B2
(45) Date of Patent: Jan. 9, 2007

(54) METHOD FOR AND ARRANGEMENT COMPRISING MEANS FOR DETERMINING THE AVAILABLE POWER CAPACITY OF AN ELECTRIC POWER SUPPLY

(75) Inventor: Jan Vet, Waalre (NL)

(73) Assignee: Sensite Solutions, B.V., Eindhoven (NL)

( * ) Notice: Subject to any disclaimer, the term of this patent is extended or adjusted under 35 U.S.C. 154(b) by 175 days.

(21) Appl. No.: 10/765,702

(22) Filed: Jan. 26, 2004

(65) Prior Publication Data

US 2004/0222798 A1 Nov. 11, 2004

(30) Foreign Application Priority Data

Jan. 27, 2003 (NL) .................................... 1022497

(51) Int. Cl.
*H01M 10/44* (2006.01)
*H01M 10/46* (2006.01)

(52) U.S. Cl. ...................................................... 320/132
(58) Field of Classification Search ................ 320/136, 320/104, 132; 324/426, 429, 428
See application file for complete search history.

(56) References Cited

U.S. PATENT DOCUMENTS

| | | | |
|---|---|---|---|
| 3,731,189 A | 5/1973 | Sharaf et al. | |
| 3,984,762 A | 10/1976 | Dowgiallo, Jr. | |
| 5,969,529 A | 10/1999 | Eiraku et al. | |
| 6,211,681 B1 * | 4/2001 | Kagawa et al. | ............. 324/426 |
| 6,363,320 B1 * | 3/2002 | Chou | ......................... 701/207 |

FOREIGN PATENT DOCUMENTS

| | | |
|---|---|---|
| EP | 0 544 121 A1 | 6/1993 |
| EP | 1 278 072 A1 | 1/2003 |
| JP | 62200277 A2 | 9/1987 |
| WO | WO 83/02005 | 6/1983 |
| WO | WO 90/06522 | 6/1990 |

* cited by examiner

*Primary Examiner*—Edward H. Tso
(74) *Attorney, Agent, or Firm*—Fenwick & West LLP

(57) ABSTRACT

The invention relates to a method and an arrangement for determining the available power capacity of an electric power supply, such as a battery, in a transmitter of a tracking and telemetry system by simulating, determining and analysing the secondary electrical behaviour of one or more electronic circuits fed by the power supply, among which electronic components and integrated circuits.

13 Claims, 4 Drawing Sheets

METHOD FOR AND ARRANGEMENT COMPRISING MEANS FOR DETERMINING THE AVAILABLE POWER CAPACITY OF AN ELECTRIC POWER SUPPLY

DESCRIPTION

The invention relates to a method and an arrangement for determining the available power capacity of an electric power supply. The invention also relates to a transmitter comprising an arrangement as described above, as well as to a tracking and telemetry system comprising such a transmitter.

Such a method and arrangement are known from U.S. Pat. No. 5,969,529, which discloses a device for determining the available power capacity of a power supply, such as a battery, in a device comprising one or more electronic circuits. In the disclosed device, a battery is loaded with a "dummy" load, and a voltage monitoring circuit determines whether the battery voltage falls below a predetermined limiting value as a result of the battery being loaded with said dummy load. Thus it is possible to determine whether the battery has sufficient power capacity available for feeding an electric circuit, e.g. having the same power consumption as the dummy load.

Many electric and electronic devices are dependent on their own electric energy source, such as a battery, whose remaining electric power must be verified regularly during use. For a large number of applications the verification of the remaining electric power capacity is necessary in order to ensure a reliable operation, but there are also many applications in which the regular verification of the residual power capacity of the power supply has advantages for the users of such applications. Think in this connection of battery-fed applications, such as hearing aids, wristwatches, transistor radios, etc. When the user is alerted to an impending lack of power capacity, he can take adequate measures in good time to prevent failure of the equipment. In the case of computer systems, which must be supplied with electric power at all times, it is also important to verify the available (residual) power capacity of the power supply on a regular basis.

In the case of battery-fed applications, it is important that said verification of the remaining power capacity takes place in a manner which requires a minimum amount of additional energy. In a tracking and telemetry system, for example, which comprises a large number of receivers and a large number of transmitters, also referred to as "tags" in English professional literature, the transmitter comprises a battery which has a service life of a few years. After the transmitter has been in use for some time, generally a few years, there is frequently no certainty as regards the remaining service life or, in other words, the residual capacity of the battery, because it is not only the amount of energy already supplied that plays a part in this regard, but also the ageing of the battery, which may in turn be influenced by the operating temperature of the battery, etc.

The transmitter, which frequently forms part of a tag that can be attached, e.g. to a person, an animal or an object, transmits an identification signal and/or further information according to a time schedule, e.g. periodically, and in order to guarantee a reliable operation of the system, it must be ready for use and remain so at all times, whatever the circumstances. Consequently, it is important that the user is informed in good time that the battery in the transmitter is running out, so that the battery, or even the entire transmitter, can be replaced.

Existing techniques are generally based on regular measurement of the changes in the battery voltage in response to an additional electric load being applied, to which end the transmitter is fitted with suitable components, such as relatively costly analog-digital (AD) conversion electronics, which take up a good deal of space.

Another drawback of this way of determining the available battery capacity, besides the above drawbacks with regard to the costs and the amount of space being taken up, is the fact that valuable electric energy is drawn from the battery for this purpose, which contributes to an undesirable reduction of the service life of the battery.

European patent application EP 1 278 072 discloses a device for verifying a battery voltage of an external battery, such as an auxiliary battery for use in case of an emergency. Analogously to U.S. Pat. No. 5,969,529, the device that is disclosed in EP 1 278 072 periodically connects a dummy circuit in parallel to the external battery, so that the battery is loaded. Subsequently the device measures a few characteristics of the supplied power and stores them in a memory. In this way the device can verify whether the external auxiliary battery has sufficient power capacity available for energizing the main circuit in case of an emergency.

A drawback of the circuits described in the aforesaid document U.S. Pat. No. 5,969,529 and the aforesaid document EP 1 278 072 is the fact that said circuits cannot be used while an electronic circuit to be fed is in operation (U.S. Pat. No. 5,969,529) or needs to be supplied with power by the auxiliary battery, since a voltage drop would directly lead to failure of the circuit. Furthermore, neither circuit is suitable for frequent use, in view of their relatively large energy consumption. The circuits, in use, require the same amount of energy as the application that is to be fed by the battery.

European patent application No. EP 0 544 121 discloses a device for measuring the internal resistance of a power supply, such as a battery. The device measures the internal resistance of the battery connected thereto by producing voltage variations.

Not only does EP 0 544 121 provide a fairly complicated circuit comprising a measuring device, an AD converter and a micro compressor, which circuit, considering its size, does not appear to be very suitable for applications such as transmitters ("tags"), which are preferably made as compact as possible, but the circuit shown in said document in particular determines the internal resistance and does not provide direct information as regards the remaining battery capacity.

Accordingly, it is a first object of the invention to provide a method for determining the available power capacity of an electric power supply in an economic and energy conserving manner.

According to the invention, this object is accomplished in that the secondary electrical behaviour of one or more electronic circuits fed by the power supply, such as electronic components and integrated circuits, is analysed.

In this connection the term secondary behaviour is understood to mean the behaviour or the operation of an electronic circuit or stimuli to be produced by the electronic circuit in response to the actual occurrence of a shortage of electric power. This in contrast to the desired behaviour of a circuit or the functions to be performed by said circuit when sufficient electric power capacity is available, also called the primary behaviour.

The invention is based on the insight that the electronic circuit or circuits already present in an arrangement can be used or reused in an advantageous manner for determining the remaining electric power capacity in a power supply.

In one embodiment of the invention, the secondary behaviour is simulated by temporarily reducing the power supply voltage that is being applied to the circuit.

By determining and analysing the behaviour of an electronic circuit, e.g. when the supply voltage being applied to the circuit is reduced by a predetermined amount, it becomes possible to pronounce upon the remaining electric power capacity of the power supply.

Imagine an electronic circuit provided with a resetting circuit for switching an electronic circuit to a quiescent or initial state when the supply voltage is too low due to the fact that insufficient electric power is available in the battery. When the supply voltage to the circuit is reduced by a predetermined amount, for example, it is possible to infer from the behaviour of the circuit as a whole, i.e. from the fact whether or not the electronic circuit is switched to the quiescent or initial state, whether the battery is supplying a voltage above or below a predetermined threshold value.

Activation of the resetting circuit leads to the conclusion that the current battery voltage has dropped below a predetermined threshold value. In the other case, the current battery voltage will be higher than the threshold value. It will be understood that in the latter case the conclusion may be that the battery still has sufficient power capacity, for example. and that in the former case the residual capacity of the battery is running dangerously low.

A person skilled in the art will understand that the method according to the invention can also be used with an electronic circuit that is fed by a current supply rather than by a voltage supply. In that case the supply current that is available for the circuit will have to be reduced by one or more predetermined values, however.

The simulation of a shortage of electric power, e.g. by temporarily reducing the supply voltage or the supply current to the electronic circuit, can take place in an economic and low-energy manner, without additionally loading the power supply, or only to a negligible extent, and without additional, relatively costly and sizeable electronics or electric components being required.

In the case of a processor-controlled electronic circuit, the method according to the invention can be used advantageously by incorporating additional intelligent, i.e. suitable "embedded" software, in the processor for activating, determining and analysing the secondary behaviour of the circuit.

According to a second aspect of the invention, there is provided an arrangement for analysing the secondary electric behaviour of one or more electronic circuits fed by the power supply, among which electronic components and integrated circuits. The arrangement preferably comprises a digital processor-controlled processing unit suitably programmed for determining and analysing the secondary behaviour of the electronic circuit, which processing unit may form part of the electronic circuit or circuits of the arrangement to be fed by the power supply.

More in particular, the arrangement may be an device in which the means for determining the available power capacity of the power supply are arranged for detecting the response of the electronic circuit to a simulated reduction of the supply voltage or the supply current.

In a preferred embodiment of the invention, the means for determining the available power capacity of the power supply comprise a series circuit of at least one resistor and a controllable semiconductor switching element.

In another embodiment of the invention, the arrangement is arranged for producing a signal or the like to indicate that the available power capacity of the power supply has fallen below a threshold value. Said signals may be produced in that the processor provides an alerting stimulus to the arrangement, which responds thereto by producing the signal or the like in question. The signal may be a directly audible or visible signal or an electrically transmitted signal.

An advantageous application of the invention is the use thereof in a transmitter, for example. Which transmitter may form part of a tracking and telemetry system comprising at least one transmitter to be attached to a person, an animal or an object and at least one receiver, which transmitter is arranged for producing a signal that identifies the transmitter, for example, and which receiver is arranged for receiving said signal.

The invention will now be described in more detail by means of a nonimitative embodiment thereof, in which description reference is made to the appended drawing, in which.

Figure 1:
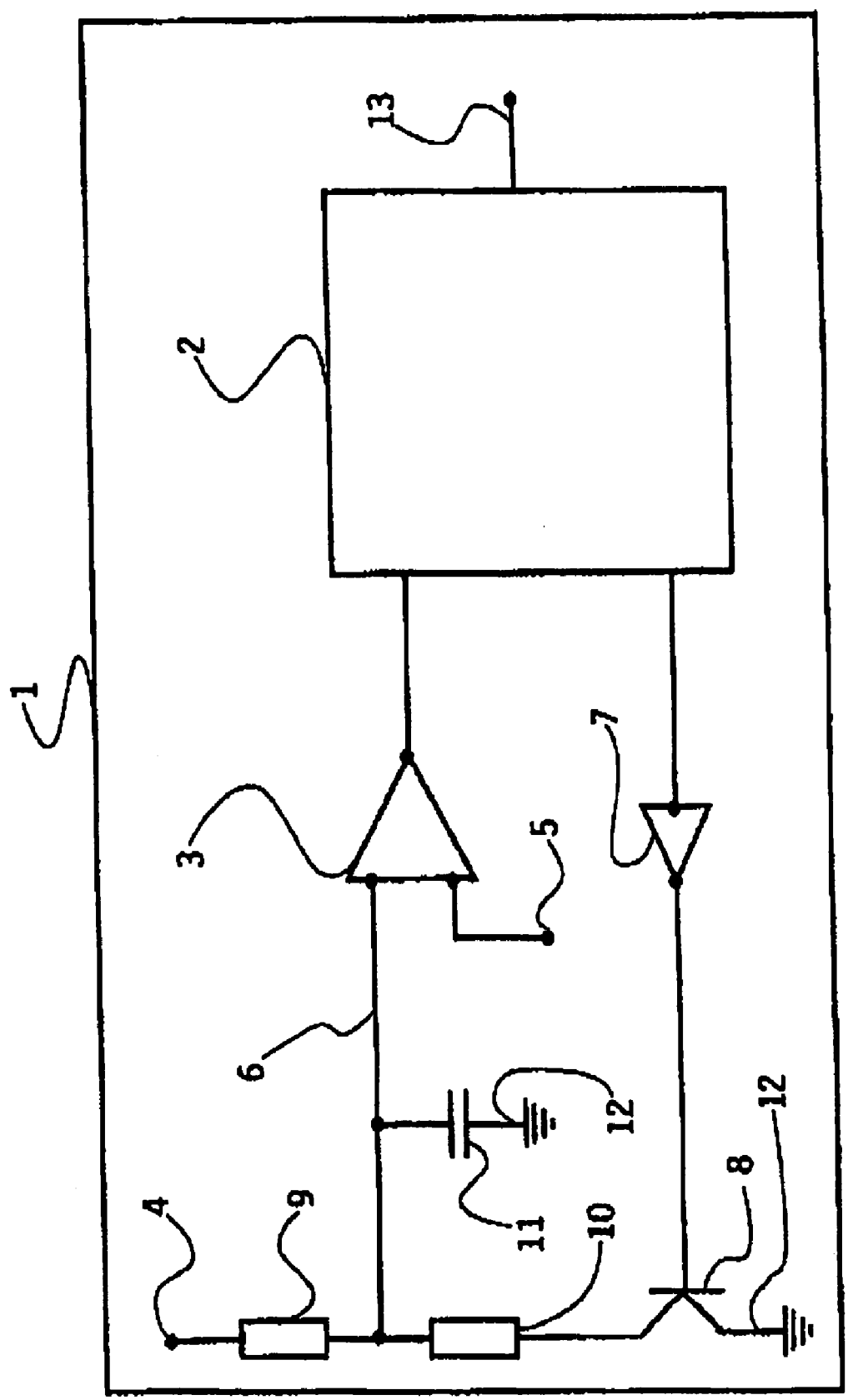
FIG. 1 is a schematic representation of a circuit for determining the available power capacity of a power supply in accordance with the invention.

FIG. 1 is a schematic representation of an electronic circuit in a arrangement 1 according to the present invention, such as a transmitter or "tag" for use in a tracking and telemetry system, which transmitter transmits an identification signal or other information signal according to a predetermined time schedule, e.g. periodically. Such a system may be used for tracking, monitoring and/or checking persons or objects in various situations. Examples of this are the geographic monitoring of persons, e.g. at home, at a home for the elderly or at school, the tracking down of roll containers in a warehouse, the guarding of objects, such as a bicycle, or the monitoring of the state of health of patients in a hospital, wherein further information is transmitted in addition to or instead of the identification signal.

The arrangement 1 comprises an electronic circuit in the form of a digital processing unit 2, such as a microprocessor or microprocessing device (microcontroller) and a comparator 3. A first input of the comparator 3 is connected to the junction 6 of a series circuit of two resistors 9 and 10, which is connected between the first and second power supply terminals 4, 12. Connected to a second input of the comparator 3 is a reference, reset or recovery voltage 5, which may also be obtained, in a manner which is known per se, from the power supply to be connected.

A capacitor 11 is furthermore connected between the junction 6 and the second supply terminal 12. The power supply to be connected to the power supply terminals 4, 12 is not explicitly shown in the figure.

The comparator 3 presents a signal to the processing unit 2 via its output in dependence on the difference between the recovery voltage 5 and the voltage on the junction 6 of the series circuit of the two resistors 9, 10.

According to one embodiment of the invention, a transistor 8 is furthermore incorporated in this series circuit of the resistors 9 and 10 with its main conducting path. The control electrode of the transistor 8 is connected to a control output of the processing unit 2 via a driver 7. The transistor 8 is a so-called NPN-type bipolar transistor. The operation is as follows.

In the inactive (i.e. non-conducting) state of the transistor 8, the capacitor 11 will be charged to the supply voltage on the first supply terminal 4. As long as the voltage on the junction 6 is higher than the recovery voltage 5, the comparator 3 will not deliver a signal to the processing unit 2.

As soon as the voltage on the junction 6 drops below the recovery voltage, because too little electric power capacity is available from the power supply, the comparator 3 will deliver a control signal to the processing circuit 2 on its output, causing the arrangement 1 to be reset to its quiescent or initial state, in order to prevent the arrangement 1 from becoming unstable or otherwise reacting undesirably, i.e. in a manner deviating from the desired or primary behaviour, when the supply voltage is too low.

In accordance with the inventive concept, a reduction of the supply voltage on the junction 6 can be simulated by switching the transistor 8 to its conducting state via the processing unit 2 and the driver 7. As a result, electric charge is drawn from the capacitor 11 and a voltage drop on the junction 6 occurs. It will be understood that the values of the resistors 9, 10, which form a voltage divider, are suitably selected in accordance with the invention in dependence on the desired voltage drop and the admissible limiting value of the supply voltage for the electronic circuits of the arrangement 1.

If the voltage on the junction 6 drops below the recovery voltage 5 during this simulation, the comparator 3 will deliver a signal on its output, as a result of which in fact a reset stimulus is generated. If the voltage drop is insufficient because the supply voltage on the power supply terminals 4, 12 is sufficiently high on account of the fact that the power supply still has sufficient electric power capacity available, no such reset stimulus will be generated, of course.

The occurrence or nonconcurrence of a reset signal in response to a control signal on the driver 7 can be processed by suitable intelligence in the processing unit 2, and the processing unit 2 can deliver an alarm signal or warning signal or the like on its output in response thereto in order to inform the user, e.g. of the fact that (too) little battery capacity is available. The user can then take action by changing either the battery or the entire arrangement 1. The latter will probably happen in the case of a transmitter of a tracking or telemetry system as described above, which transmitters are often configured as a thin or flat tag with embedded electronics and a battery.

It will be understood that when the secondary behaviour of the circuit is used in this manner for testing the available battery capacity, the circuit 1 will not be reset, of course, because this can be detected by the processing unit 2, since the entire action was initiated by the processing unit 2. As a result of this, and because the circuit consumes very little energy because the resistors 9, 10 and the capacitor 11 can be dimensioned so that only a relatively small amount of electric energy needs to be drawn therefrom, no appreciable amount of valuable battery energy will be wasted on determining the power capacity state of the battery or power supply.

Those skilled in the art will appreciate that according to a further embodiment of the invention various series circuits of resistors 9 and 10 and one or more transistors 8 may be used for simulating a voltage drop at different values in order to form a more precise picture of the (residual) capacity of the connected power supply. Any suitable type of semiconductor switching element may be used instead of a bipolar transistor.

When power is supplied by a current supply, the transistor 8 is suitably switched to reduce the supply current to the processing unit 2.

The results of the simulation can be advantageously translated into an expected service life of the power supply. For example, by means of a computation or by means of a conversion table (undisturbed) stored in the processing unit 2 or in a nonvolatile memory that is linked therewith.

Those skilled in the art will appreciate that implementation of the inventive concept in the circuit as shown in FIG. 1 in fact only requires the addition of a driver 7 and a transistor 8 to the circuit or to the arrangement in order to be able to make use of the secondary behaviour of the circuit 2. No costly AD converters or other sizeable components other than a transistor 8, a driver 7 and resistors 9 and 10, adapted if necessary, or a number of these circuits, if necessary, are required, therefore. The amount of electric charge that is drawn from the capacitor 11 for the purpose of the invention is negligible.

Figure 2:
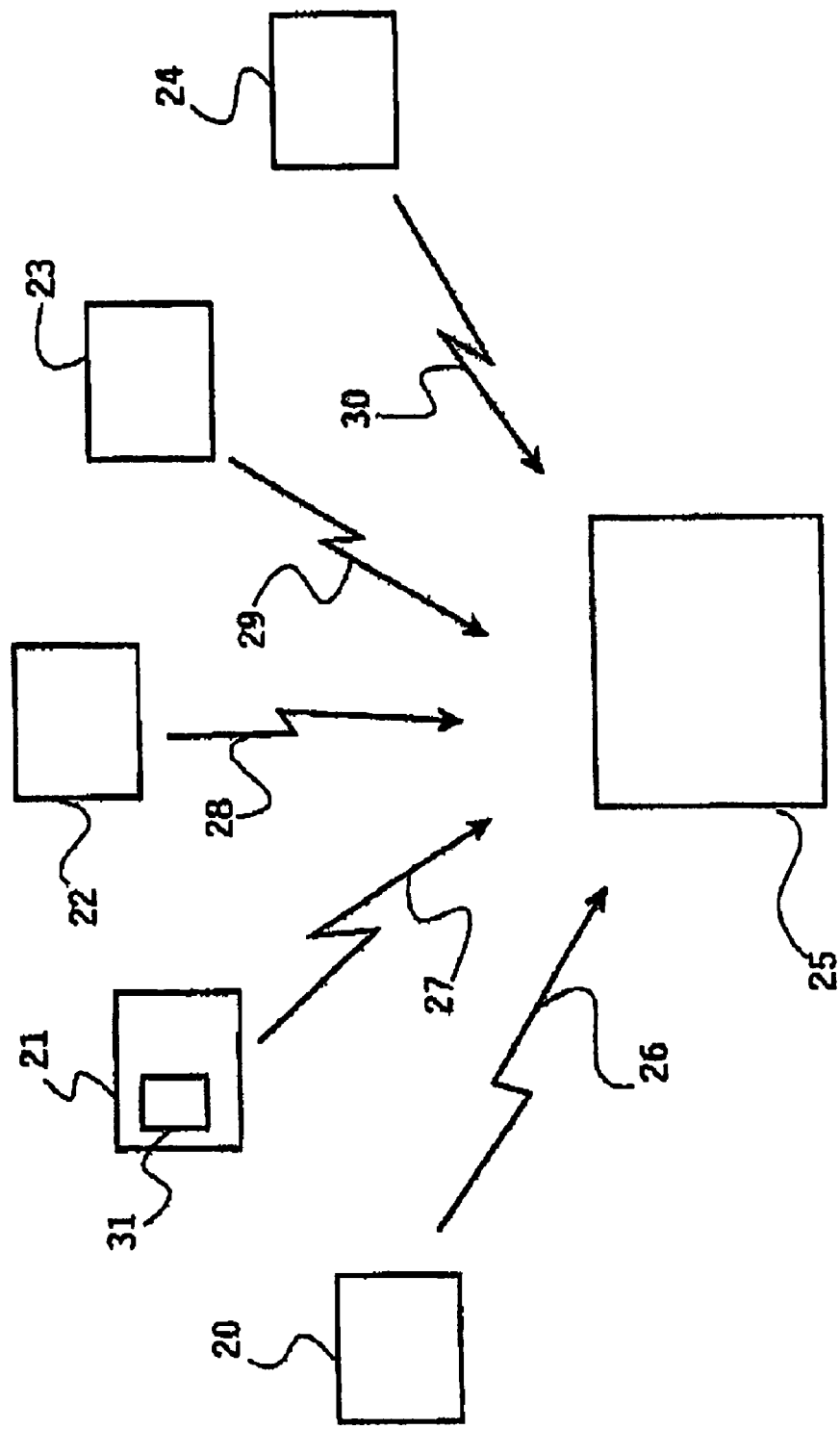
FIG. 2 shows a tracking and telemetry system according to the invention.

FIG. 2 shows a tracking and telemetry system according to one embodiment of the invention, wherein a number of transmitters 20, 21, 22, 23, 24 periodically transmit identification signals 26, 27, 28, 29, 30, which are received and processed by a receiver device 25. Such a tracking and telemetry system may be used in a warehouse for localising roll containers, for example, or in a nursing home for localising residents and monitoring their state of health. In particular, the transmitters may comprise sensors or other input means, such as a sensor 31 forming part of the transmitter 21. Such sensors and/or input means may consist of, for example, temperature sensors, humidity sensors, pressure sensors, pulsometers, sphygmometers, light sensors, clocks, sound sensors, motion sensors or input means such as alarm buttons, microphones, localising means such as GPS, and the like, wherein the information obtained from said sensors and said input means can be added to the identification signal that is to be transmitted periodically.

Figure 3:
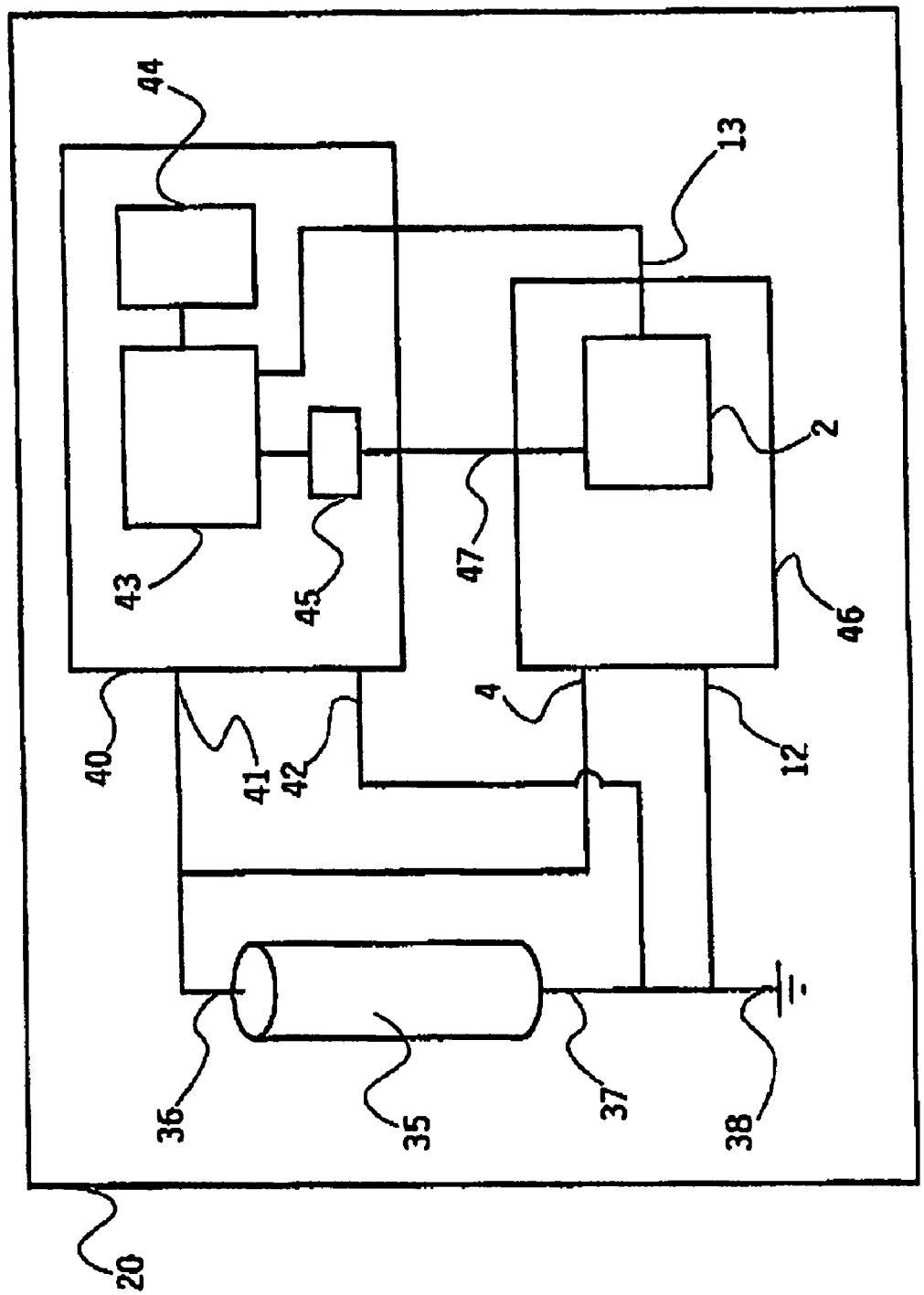
FIG. 3 shows a transmitter for use in a tracking and telemetry system according to the invention.

In FIG. 3 the operation of the transmitter 20 is schematically shown. The transmitter comprises a power supply 35, such as a battery, e.g. comprising a positive (36) and a negative (37) voltage output. The negative voltage output is connected to earth 38. The power supply provides the circuit 40 with voltage via the terminals 41 and 42. The circuit 40, of which only a few components are schematically shown, comprises a processing unit 43, such as a microprocessor, a transmitter device 44 and means 45 for resetting or switching the circuit 40 to an initial state.

The transmitter 20 furthermore comprises a circuit 46 analogous to the circuit 1 that is shown in FIG. 1, which comprises voltage terminals 4 and 12, terminal 12 of which is connected to earth 38. The circuit 46 also comprises a processing unit 2 which, when the power voltage is too low, can produce a warning signal which is delivered to the circuit 40 via the output 13. In order to make it possible to analyse the secondary behaviour of the circuit 40, the processing unit 2 is connected, via the connection 47, to the means 45 for resetting and/or switching the arrangement to an initial state. The operation of the circuit 46 is analogous to that of the circuit 1 which is shown in FIG. 1.

In FIG. 3, separate circuits 40 and 46 and separate individual parts 2, 43 and 45 and the associated connections 13 and 47 are schematically shown. A person skilled in the art will appreciate that the circuits 40 and 46 may be suitably integrated in one circuit, and that the components 2, 43 and 45 may be made up of one integrated circuit (IC). This is advantageous in connection with the amount of space that is taken up by the circuit, and in addition it may have advantages as regards the cost involved.

Figure 4:
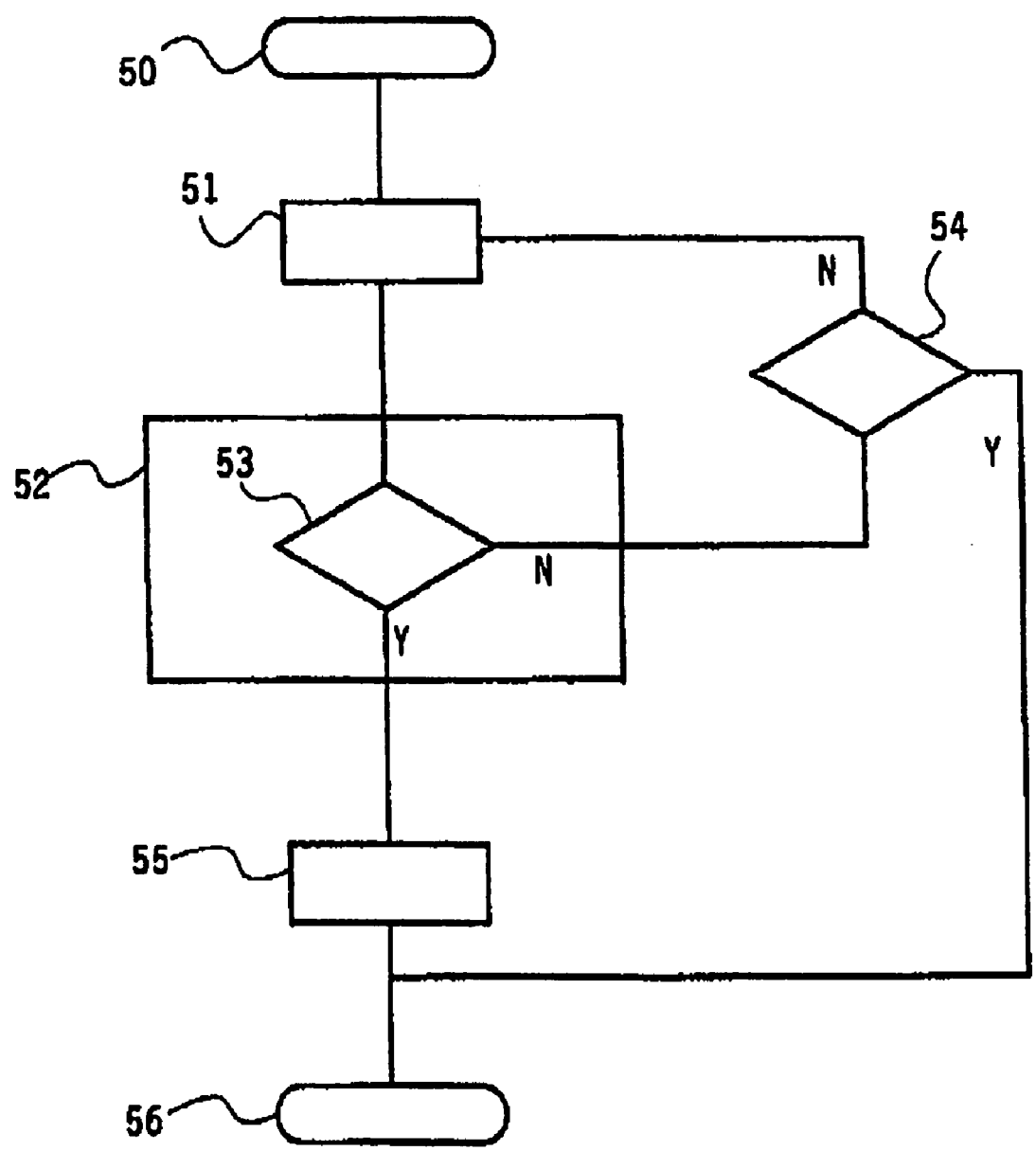
FIG. 4 shows a method according to the invention.

FIG. 4 schematically shows a method according to the invention for determining the power capacity of an electric power supply. The start of the method is indicated at 50 and the end is indicated at 56. In step 51, the supply voltage that is being supplied to an device is slightly reduced. The analysis of the secondary behaviour of the arrangement takes place in step 52, which primarily consists of determining in step 53 whether a reset stimulus is being produced in the arrangement. If such a reset stimulus is indeed produced in response to the reduction of the supply voltage in step 51, and the result of step 53 is affirmative, therefore, a warning signal will be generated in step 55, e.g. on the output 13 of the circuits 1 and 46 in FIGS. 1 and 3. Said warning signal may continue for some time, after which the method for determining the available power capacity is terminated (56).

If no reset stimulus is produced in response to the reduction of the supply voltage in step 51, and the result of step 53 is negative, therefore, the method will continue with step 54. In step 54 it is determined whether it is possible to reduce the supply voltage even further or whether a maximum reduction of the supply voltage has been reached. If such a maximum reduction of the supply voltage has not been reached yet, the result of step 54 is negative, and the method will continue with step 51 again, in which the supply voltage is reduced once again. If the maximum reduction of the supply voltage has been reached, however, and the result of step 54 is affirmative, therefore, the method will be terminated, in which connection it is noted that the available power capacity of the power supply is apparently sufficient in that case.

The illustrated embodiments are exclusively intended to illustrate the invention as described herein. The scope of the invention described herein shall only be limited by the appended claims.

The invention claimed is:

1. A method for determining the available power capacity of an electric power supply connected to an arrangement comprising one or more electronic circuits, characterized in that the secondary electrical behavior of one or more electronic circuits fed by the power supply is analyzed by temporarily reducing the power supplied by said power supply to said one or more electronic circuits.

2. A method according to claim 1, characterized in that the voltage or the current supplied by the power supply is reduced in steps.

3. A method according to claim 1, characterized in that said secondary electrical behavior comprises the resetting or switching to an initial state of one or more of said electronic circuits.

4. A method according to claim 1, characterized in that the secondary electrical behavior is activated, determined and analyzed by a suitably programmed, processor-controlled processing unit.

5. An arrangement comprising one or more electronic circuits including electronic components and integrated circuits to be fed by an electric power supply, and means for determining the available power capacity of the power supply, characterized in that said means for determining the available power capacity are arranged for analyzing the secondary electrical behavior of one or more of said electronic circuits by temporarily reducing the power supplied by said power supply to said one or more electronic circuits.

6. An arrangement according to claim 5, characterized in that said means for determining the available power capacity of the power supply are arranged for activating, determining and analyzing the secondary electrical behavior of one or more of said electronic circuits.

7. An arrangement according to claim 5, characterized in that said means for determining the available power capacity of the power supply are arranged for producing a signal as soon as the available power capacity of the power supply is lower than a threshold value.

8. An arrangement according to claim 5, characterized in that said means for determining the available power capacity of the power supply comprise a series circuit of at least one resistor and a controllable semiconductor switching element.

9. An arrangement according to claim 5, characterized in that at least one of said electronic circuits is a circuit for resetting or switching the arrangement to an initial state.

10. An arrangement according to claim 5, characterized in that said means for determining the available power capacity of the power supply comprise a suitably programmed processor-controlled processing unit.

11. An arrangement according to claim 10, characterized in that said processing unit forms part of the electronic circuit or circuits to be fed by the power supply.

12. A tracking and telemetry system comprising at least one transmitter and at least one receiver, which transmitter is arranged for producing a signal that identifies the transmitter, and which receiver is arranged for receiving said signal, characterized in that said transmitter furthermore comprises an arrangement according to claim 5.

13. A transmitter for use in a tracking and telemetry system according to claim 12.

* * * * *